United States Patent
Yokomichi

(10) Patent No.: US 7,091,467 B2
(45) Date of Patent: Aug. 15, 2006

(54) IMAGE SENSOR

(75) Inventor: Masahiro Yokomichi, Chiba (JP)

(73) Assignee: Seiko Instruments Inc., (JP)

( * ) Notice: Subject to any disclaimer, the term of this patent is extended or adjusted under 35 U.S.C. 154(b) by 0 days.

(21) Appl. No.: 10/935,612

(22) Filed: Sep. 7, 2004

(65) Prior Publication Data

US 2005/0056770 A1    Mar. 17, 2005

(30) Foreign Application Priority Data

Sep. 12, 2003    (JP)    ............. 2003-322001

(51) Int. Cl.
*H01L 27/00* (2006.01)
*H01J 40/14* (2006.01)

(52) U.S. Cl. ............. 250/208.1; 250/214 R; 250/214 LS; 348/308

(58) Field of Classification Search ............. 250/208.1, 250/214 R, 214 LS, 214 SW; 348/303, 304, 348/307, 308, 482, 483
See application file for complete search history.

(56) References Cited

U.S. PATENT DOCUMENTS 5,784,178 A * 7/1998 Tsai et al. ............ 358/482
6,803,957 B1 * 10/2004 Machida et al. ........ 348/308

* cited by examiner

*Primary Examiner*—Kevin Pyo
(74) *Attorney, Agent, or Firm*—Adams & Wilks

(57) ABSTRACT

An image sensor has light receiving elements, switching elements for reading out output signals from the light receiving elements, a scanning circuit array for driving the switching elements, and a common signal line connected to the switching elements for transmitting the output signals from the light receiving elements. An operational amplifier is connected to the common signal line through a chip selection switch and is operated by a single power supply under the GND power supply standard common to the image sensor for outputting the output signals to an image signal output terminal. A reset switch is connected to the common signal line for supplying a reference voltage to the common signal line. The reset switch and the switching elements turn ON to reset the light receiving elements to the reference voltage after reading out the output signals from the light receiving elements to the common signal line.

8 Claims, 4 Drawing Sheets

IMAGE SENSOR

BACKGROUND OF THE INVENTION

1. Field of the Invention

The present invention relates to a one-dimensional image sensor that receives reflection light from an original to which light is irradiated, and converts a light signal into an electric signal.

2. Description of the Related Art

A conventional image sensor IC uses a method of reading out the outputs of photoelectric conversion elements to a third common line SL3 by sequentially turning on switches SW2n to SW2 (n+1)+1, as shown in FIG. 6. The third common line SL3 is connected to a first terminal of a reset gate RG, and a second terminal of the reset gate RG is connected to a GND terminal. The reset gate RG is used by clamping the third common line SL3 to a GND potential, in accordance with a control signal Q2 of a control circuit CC (see JP 02-262760 A).

In the one-dimensional image sensor which is configured such that a plurality of image sensors IC are straightly mounted on a substrate, the common line of output terminals becomes a long wiring. Thus, capacitance and resistance components of the output terminals serve as a load, which reduces the signal level of the output signal. The above-mentioned one-dimensional image sensor has a built-in amplifier so that the drop in the signal level of the output signal is suppressed.

When the IC is driven by a single power supply in such a way that the signal line connected to an input terminal of the amplifier belongs to a linear region of the amplifier, a light receiving element is reset to a reference voltage value, or a common signal line is reset. Consequently, an offset is given, thereby adjusting an input voltage range.

However, in the above-mentioned conventional method, the process variation inside a wafer surface brings about the variation in the offset voltage for each IC, and this consequently makes the output voltage of the IC different for each unit block, and results in a problem that the output voltages are stepped.

FIG. 7 is the circuit example using the conventional image sensor. A plurality of image sensors IC of unit blocks 25 are connected to each other. Respective clock signal terminals CLK are connected to a CLK common line 19, an image signal terminal SIG is connected to an SIG common line 20, and the SIG common line 20 is connected through an external image output terminal SIG to a non-inversion input terminal of an operational amplifier 21 operated by a single power supply under a GND power supply standard of the image sensor. Then, at a ratio of a resistor 22 of a resistance value R3 to a resistor 23 of a resistance value R4, a non-inversion amplification is performed on the image signal SIG, and it is outputted from a VOUT terminal. A capacitance 24 is a pseudo capacitance CCPL of the CLK common line 19 and the SIG common line 20.

FIG. 8 shows the output waveform in which the image sensor shown in FIG. 7 is used. When it is configured such that an amplifying circuit is not built in the IC in order to avoid the stepped situation of the output voltages as mentioned above, a high resistance state occurs at the time of the signal output, which receives the influence of the wiring layout of the substrate. In particular, when the pseudo capacitance CCPL between a CLK control signal line and the SIG common line is large, a potential VSIG of the image signal terminal SIG receives the influence of the under-shoot-noise of a CLK signal, and may be possibly equal to or less than 0 V of the GND voltage.

When an external amplifier in which the GND voltage is driven by a common single power supply is used under this condition, the under-shoot-noise of the potential VSIG as mentioned above becomes equal to or less than the input voltage range of the external amplifier, and because of the circuit configuration, a response signal is delayed, and in particular, this results in a problem that as the speed of the operation is faster, the image signal receives the severer influence.

SUMMARY OF THE INVENTION

The present invention solves the conventional above-mentioned problems. It is therefore an object of the present invention to reduce the output step difference for each block in the image sensor and improve the uniformity of the output voltages at the time of the high speed drive even if the external amplifier driven by the single power supply is used.

An image sensor according to the present invention includes: a light receiving element circuit array composed of a plurality of light receiving elements for outputting output signals based on light reception amounts; a switching element circuit array composed of a plurality of switching elements for reading out the output signals; a control circuit for driving the switching elements, reading out the output signals, and returning the light receiving elements to initial states; a first common signal line for transmitting the read out output signals to image signal output terminals; and a reference voltage terminal for supplying a reference voltage to the first common signal line, in which: the first common signal line is connected through a first reset switch to the reference voltage terminal; and the control circuit operates the switching elements to read out the output signals from the light receiving elements to the common signal line, and then operates the first reset switch to supply the reference voltage from the reference voltage terminal to the first common signal line, and returns the light receiving elements to the initial states.

Consequently, even if the pseudo capacitance causes the occurrence of the under-shoot-noise in the CLK signal and then the image signal becomes equal to or less than 0 V which is the GND voltage, the loss of a waveform can be protected without any delay in the output signal of the external amplifier driven by the single power supply.

Moreover, the amplifier need not be built in the IC. Thus, it is possible to remove the step difference in the output voltages in which the process variation inside the wafer surface causes the variation in the offset voltage for each IC so that the output voltage of the IC is different for each unit block.

As mentioned above, the present invention can provide the image sensor that is designed by straightly arranging and mounting the plurality of linear image sensors IC without any amplifying amplifier or buffer amplifier inside the IC, wherein as for the reset voltage to initialize the light receiving element inside the IC and the reset voltage to initialize the common signal line or image output terminal, since the reference voltage circuit is configured inside the IC or the reference voltage is supplied from outside, the image signal, which receives the influence of the under-shoot-noise of the CLK signal because of the pseudo capacitance between the image signal SIG line and the CLK wiring peculiar to the long IC, can be set not to be equal to or less than 0 V of the GND voltage, which consequently enables the obtainment of the output having the excellent uniformity in the case of using the external amplifier driven by the single power supply.

DETAILED DESCRIPTION OF THE PREFERRED EMBODIMENTS

[First Embodiment]

Figure 1:
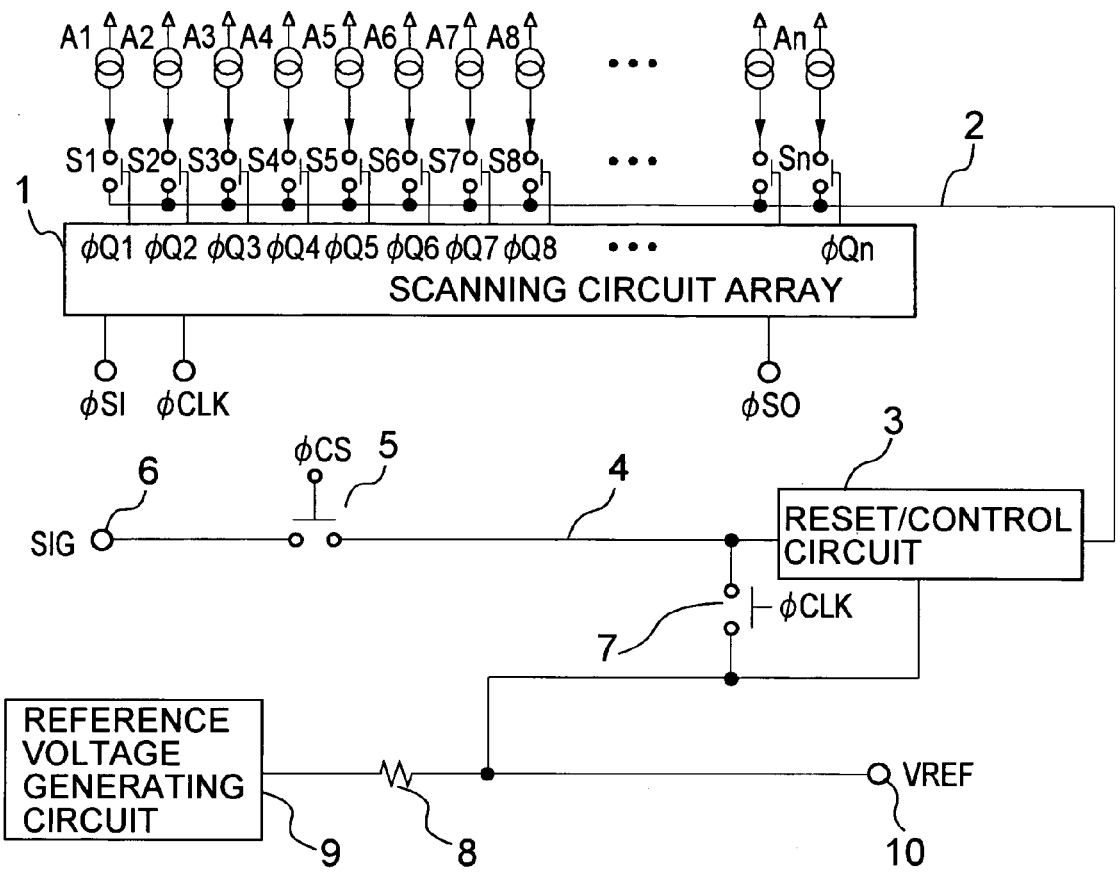
FIG. 1 is a circuit diagram of an image sensor IC according to a first embodiment of the present invention.

FIG. 1 is the entire circuit diagram of an image sensor IC according to a first embodiment of the present invention. Output terminals of photoelectric conversion elements A1, A2 to An are connected to input terminals of read out switching elements S1, S2 to Sn, respectively. Control terminals of the respective read out switching elements are connected to output terminals Q1, Q2 to Qn of a scanning circuit array 1, respectively, and output terminals of the respective read out switching elements are connected to a first common signal line 2.

The first common signal line 2 is connected to a first input terminal of a control circuit 3, and an output terminal of the control circuit 3 is connected to a second common signal line 4, and the second common signal line 4 is connected to an input terminal of a chip selection switching element 5 and an output terminal of a first clamp switching element 7. An output terminal of the chip selection switching element 5 is connected to an image signal output terminal 6.

A second input terminal of the control circuit 3 and an input terminal of the first clamp switching element 7 are short-circuited to each other, and connected to a reference voltage output terminal 10 to give a reset potential and a first terminal of a resistor 8, and a second terminal of the resistor 8 is connected to an output terminal of a reference voltage generating circuit 9.

Figure 2:
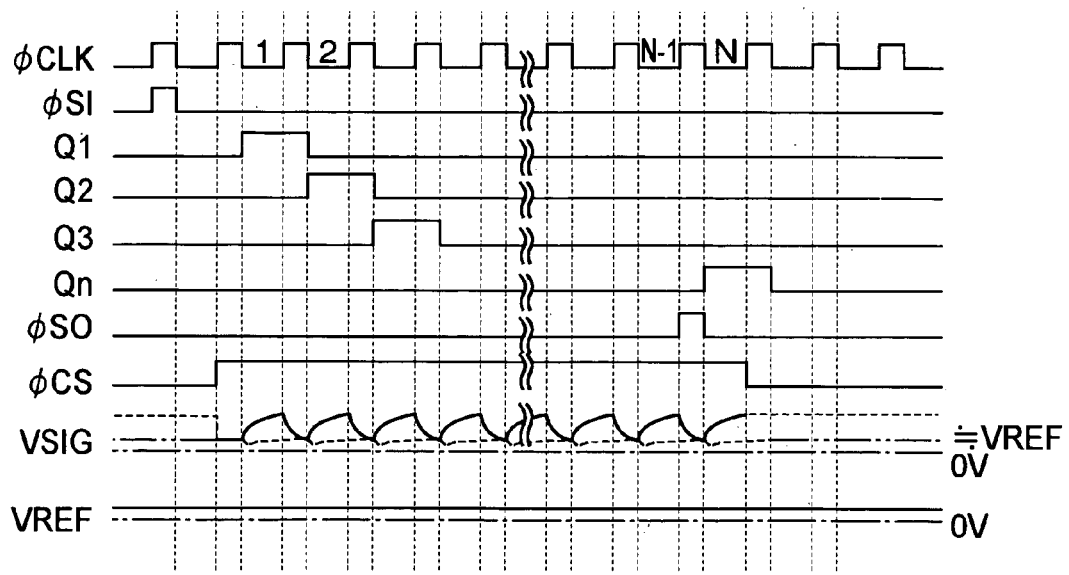
FIG. 2 is a timing chart of the image sensor IC according to the first embodiment of the present invention.

FIG. 2 is a timing chart of the image sensor IC in the first embodiment of the present invention. A symbol φCLK indicates a clock pulse, a symbol φSI indicates a start signal, and symbols Q1, Q2, Q3 to Qn indicate signals for controlling the read out switching elements, respectively. Naturally, the scanning circuit array generates a scanning signal so that the read out switching elements are sequentially turned on, stage by stage, in a shift register composed of n or more flip-flops.

A symbol φSO indicates a start signal of an image sensor in a next stage unit block, and a symbol φCS indicates a control signal of a chip selection switching element, and it becomes conductive in the period until the completion of the outputs of the image signals of n bits in the image sensor selected on the basis of the start signal. All of them become conductive at a High level and become non-conductive at a Low level. A symbol VSIG indicates an image signal output which is photo-electrically converted. A symbol VREF indicates a reference voltage generated by a reference voltage generating circuit of the image sensor or a reference voltage supplied through a reference voltage terminal VREF from outside.

Since the respective switching elements are operated as mentioned above, for example, an image signal obtained by a first photoelectric conversion element A1 is read out to the first common signal line when the first switching element S1 is turned on. After the image signal is sufficiently read out, it is reset to the reference voltage VREF through the read out switching element S1 by the reset/control circuit 3, in the period of the High level of the φCLK. Moreover, the image signal is clamped to the reference voltage VREF in the period of the High level of the φCLK, by the clamp switching element 7 on the second common signal line.

This operation is sequentially repeated, and the plurality of read out switching elements are controlled, and the image signal is read out in which a dark time output is defined as the reference voltage VREF standard. Thus, the operation of a line type image sensor is obtained.

[Second Embodiment]

Figure 3:
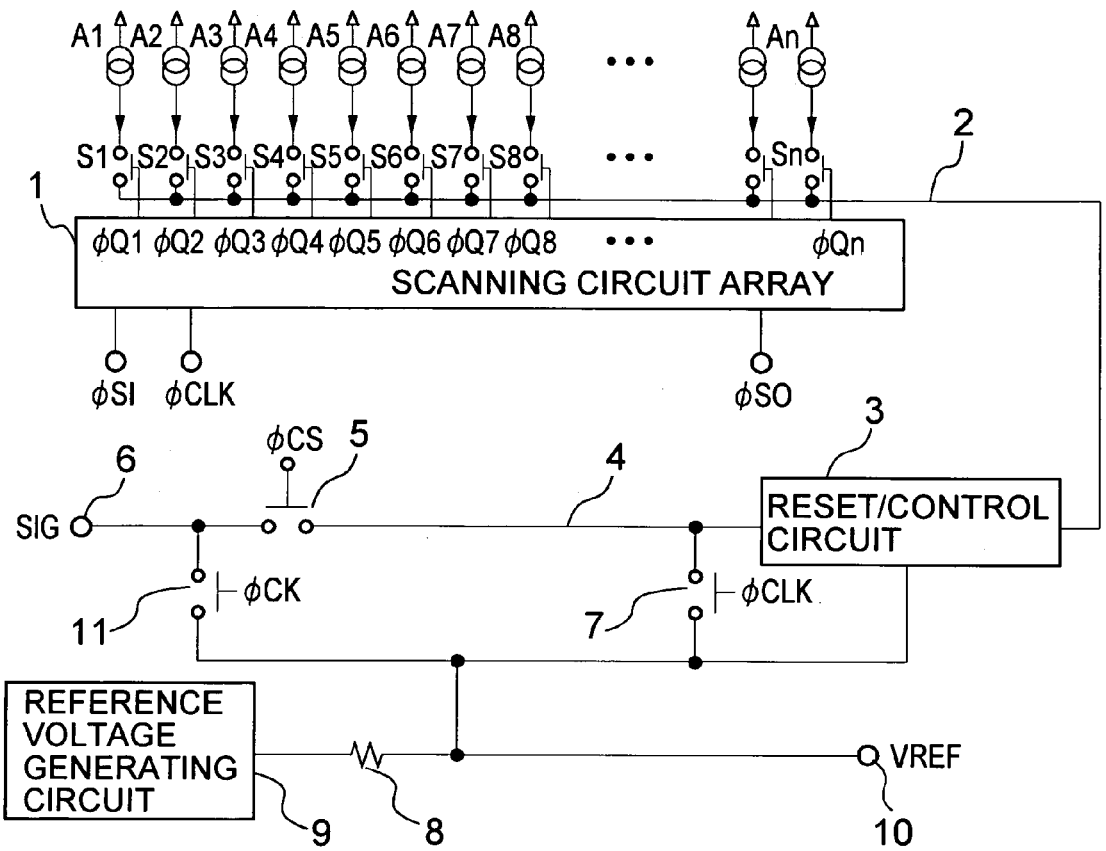
FIG. 3 is a circuit diagram of an image sensor IC according to a second embodiment of the present invention.

FIG. 3 is the entire circuit diagram of the image sensor IC according to a second embodiment of the present invention. The same symbols are given to the same elements as FIG. 1. In this image sensor, the output terminals of the photoelectric conversion elements A1, A2 to An are connected to the input terminals of the read out switching elements S1, S2 to Sn, respectively, and the control terminals of the respective read out switching elements are connected to the output terminals Q1, Q2 to Qn of the scanning circuit array 1, respectively, and the output terminals of the respective switching elements are connected to the first common signal line 2.

The first common signal line 2 is connected to the first input terminal of the control circuit 3, and the output terminal of the control circuit 3 is connected to the second common signal line 4, and the second common signal line 4 is connected to the input terminal of the chip selection switching element 5 and the output terminal of the first clamp switching element 7. The output terminal of the chip selection switching element 5 is connected to an image signal output terminal 6.

The second input terminal of the control circuit 3 and the input terminal of the first clamp switching element 7 are short-circuited to each other, and connected to the reference voltage output terminal 10 to give a reset potential and the first terminal of the resistor 8, and the second terminal of the resistor 8 is connected to the output terminal of the reference voltage generating circuit 9. An output terminal of the chip selection switching element 5 is connected to a second clamp switching element 11.

Figure 4:
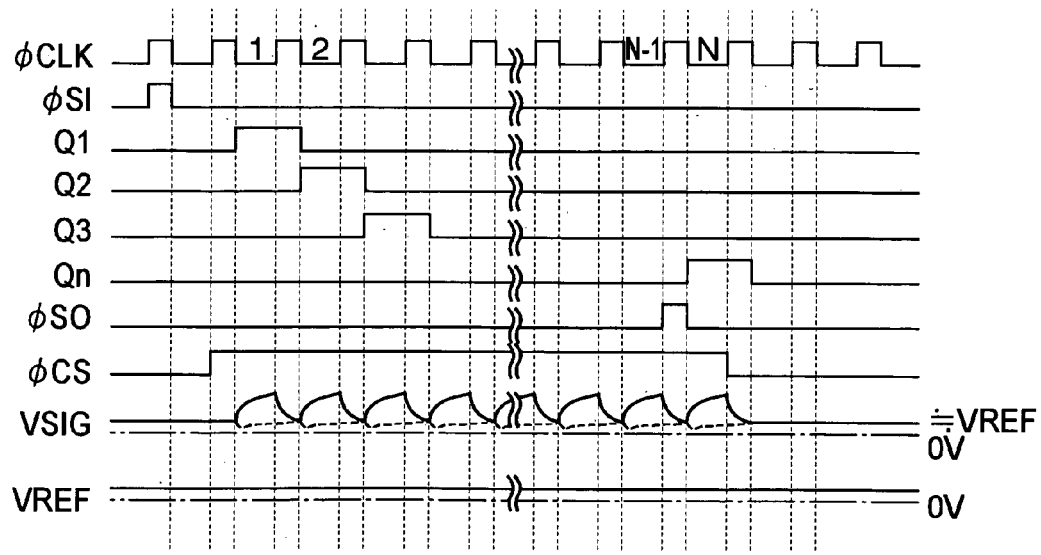
FIG. 4 is a timing chart of the image sensor IC according to the second embodiment of the present invention.

FIG. 4 is a timing chart of the image sensor IC in the second embodiment of the present invention. A symbol φCLK indicates a clock pulse, a symbol φSI indicates a start signal, and symbols Q1, Q2, Q3 to Qn indicate the signals for controlling the read out switching elements, respectively. Naturally, the scanning circuit array generates a scanning signal so that the read out switching elements are sequentially turned on, stage by stage, in a shift register composed of n or more flip-flops.

A symbol φSO indicates the start signal of a next image sensor, and a symbol φCS indicates the control signal of the chip selection switching element, and it becomes conductive in the period until the completion of the outputs of the image signals of n bits in the image sensor selected on the basis of the start signal. All of them become conductive at a High level and become non-conductive at a Low level. A symbol VSIG indicates an image signal output which is photo-electrically converted. A symbol VREF indicates the reference voltage generated by the reference voltage generating circuit of the image sensor or the reference voltage supplied through the reference voltage terminal VREF from outside.

Since the respective switching elements are operated as mentioned above, for example, the image signal obtained by the first photoelectric conversion element A1 is read out to the first common signal line when the first switching element S1 is turned on. After the image signal is sufficiently read out, it is reset to the reference voltage VREF through the read out switching element S1 by the reset/control circuit 3, in the period of the High level of the φCLK. Moreover, the image signal is clamped to the reference voltage VREF in the period of the High level of the φCLK, by the clamp switching elements 7 and 11 on the second common signal line. Consequently, the wiring between the chip selection switching element 5 and the image signal output terminal 6 and even the wiring connected to them can be set to the constant potential of the reference voltage VREF.

This operation is sequentially repeated, and the plurality of read out switching elements are controlled, and the image signal is read out in which a dark time output is defined as the reference voltage VREF standard. Also, even during the fly-back period in which the outputs of the image signals of the n bits are completed, the image signal output terminal is clamped to the reference voltage VREF in the period of the High level of the φCLK. Thus, the operation of a line type image sensor is obtained.

Figure 5:
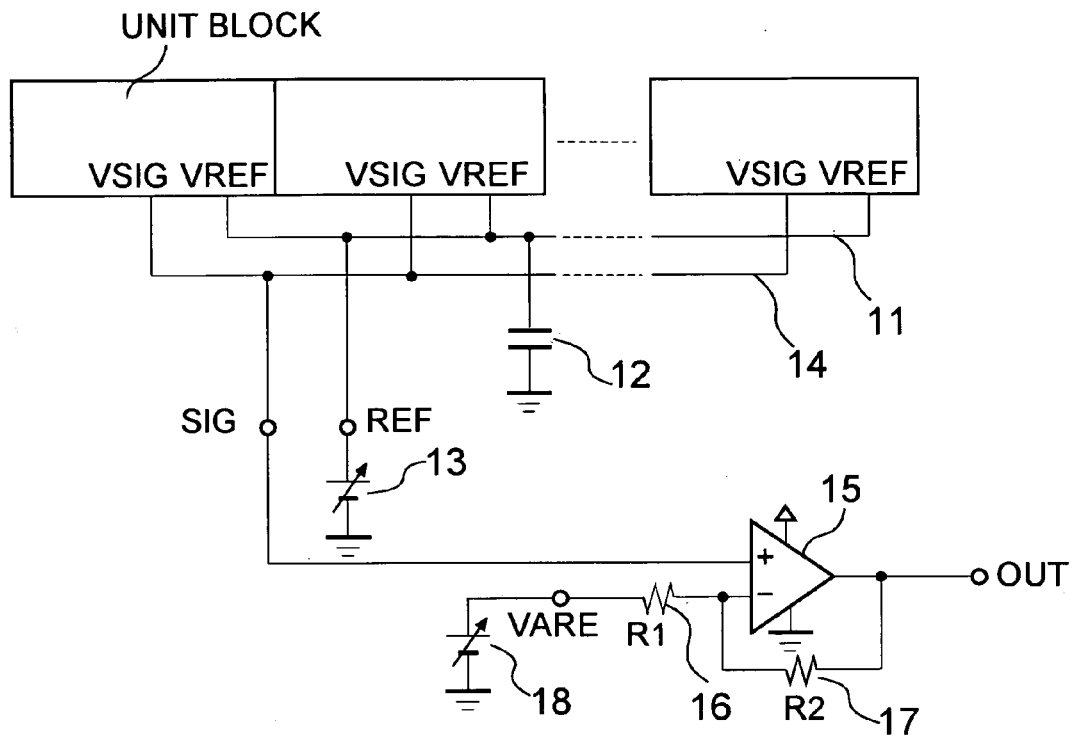
FIG. 5 is a circuit example of an image sensor which uses the image sensor IC of the present invention.
Figure 6:
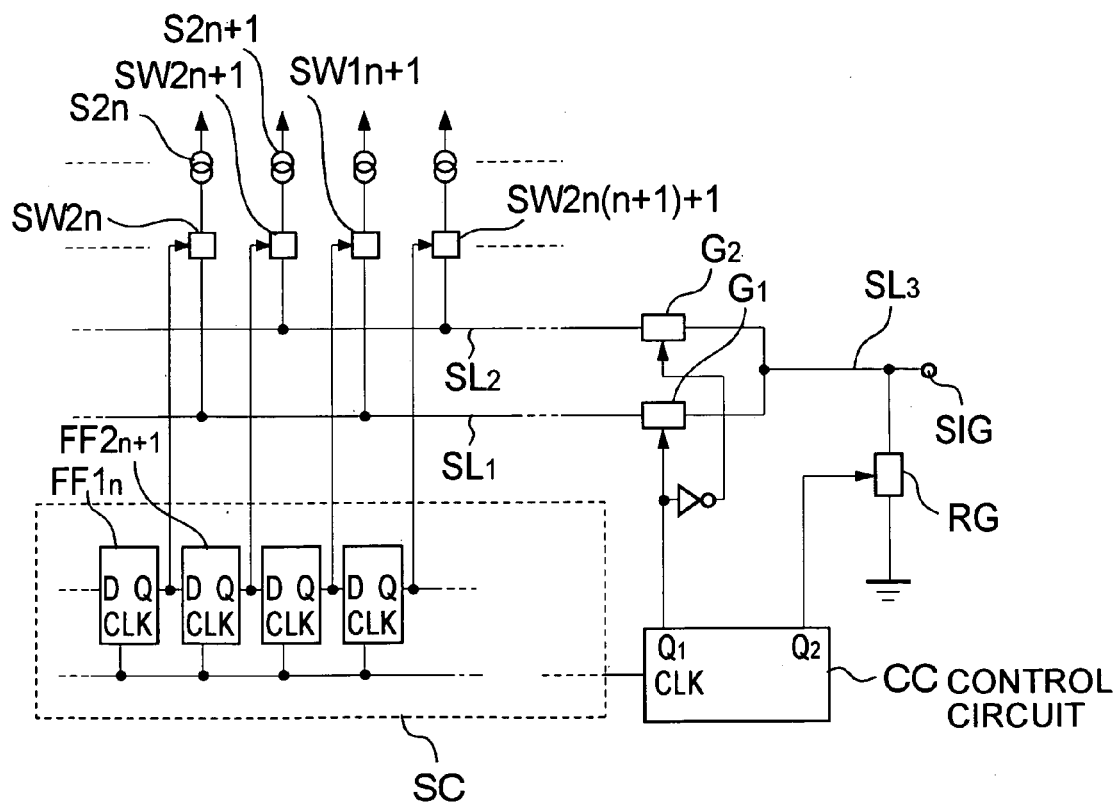
FIG. 6 is a circuit diagram of a conventional image sensor IC.
Figure 7:
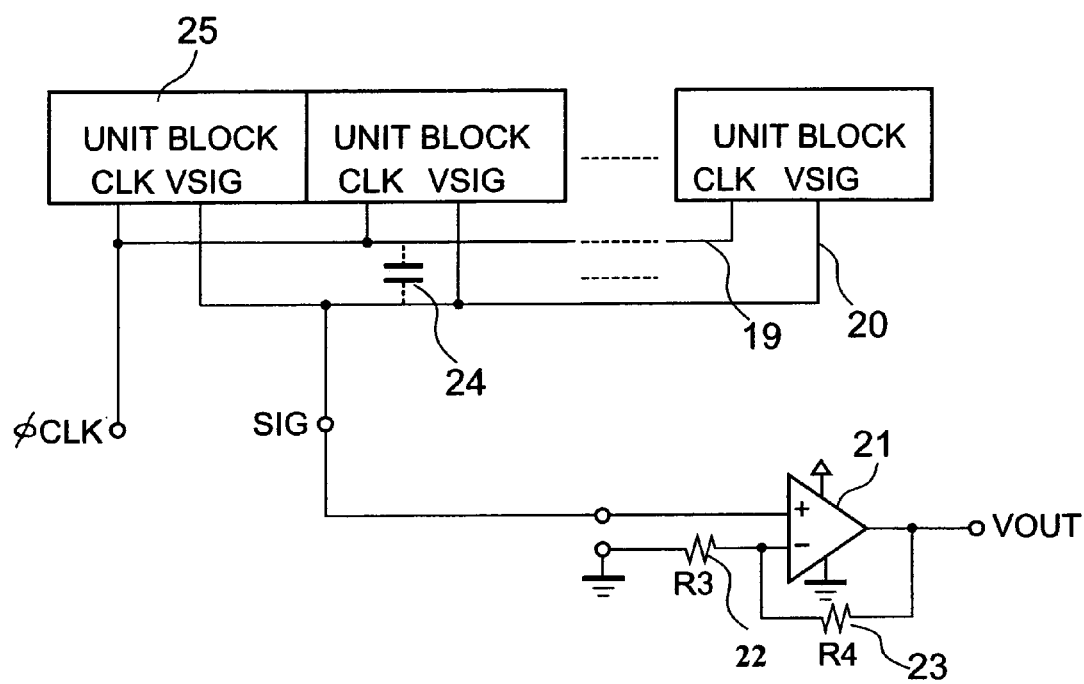
FIG. 7 is a circuit diagram of an image sensor which uses the conventional image sensor IC.
Figure 8:
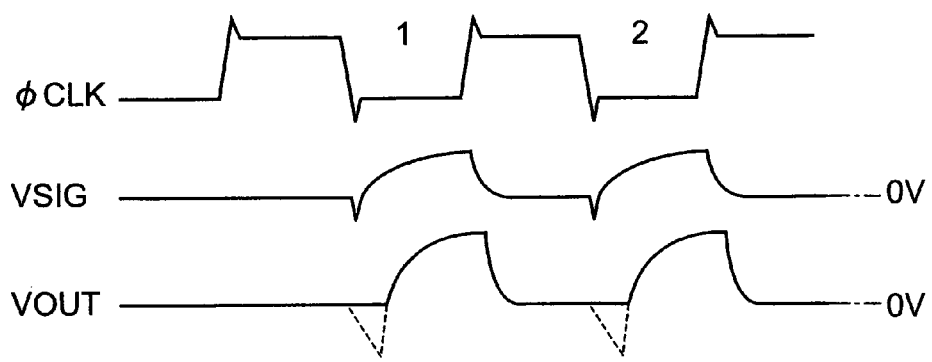
FIG. 8 shows a waveform of the image sensor of FIG. 7.

FIG. 5 is a circuit example of the image sensor which uses the image sensors IC of the present invention. The image sensor IC of the present invention is indicated as the unit block. For convenience, the input/output terminals including the power supply except the SIG output terminal and a REF output terminal are omitted. The plurality of image sensors IC of the unit blocks are connected to each other.

The respective reference voltage terminals VREF are connected to a common line 11, the common line 11 is connected to a first terminal of a condenser 12 and an external terminal REF, and a second terminal of the condenser 12 is connected to GND. Due to the connection of the condenser 12, it is possible to feed back the voltage in which the reference voltages of the reference voltage terminals VREF generated inside the respective image sensors are averaged. Also, through the external terminal REF, the voltage from an external power supply 13 can be supplied to the reference voltage terminals VREF of the respective image sensors.

Respective image signal terminals SIG are connected to a common line 14, and the common line 14 is connected through an external image output terminal SIG to a non-inversion input terminal of an operational amplifier 15.

The operational amplifier 15 is an operational amplifier which is operated by a single power supply under the GND power supply standard common to the image sensor. A first terminal of a resistor 16 having a resistance value R1 and a first terminal of a resistor 17 having a resistance value R2 are connected to an inversion input terminal of the operational amplifier 15, and a second terminal of the resistor 16 is connected to an operational amplifier reference voltage source 18. A voltage VAREF is given to the operational amplifier reference voltage source 18. A second terminal of the resistor 17 is connected to an output terminal OUT of the operational amplifier 15.

As mentioned above, the image sensor is designed such that the image signal is amplified through the noninversion amplification of (R1+R2)/R1 times, and the offset voltage of the operational amplifier 15 is compensated by the VAREF× (R1+R2)/R1 times, and the image signal is consequently outputted from the output terminal OUT.

What is claimed is:

1. An image sensor comprising: a light receiving element circuit array comprised of a plurality of light receiving elements for outputting output signals based on light reception amounts; a switching element circuit array comprised of a plurality of switching elements for reading out the output signals from the light receiving elements; a scanning circuit array for driving the switching elements of the switching element circuit array; a common signal line connected to the plurality of switching elements for transmitting the output signals from the light receiving elements; an operational amplifier connected to the common signal line through a chip selection switch and operated by a single power supply under the GND power supply standard common to the image sensor for outputting the output signals to an image signal output terminal; and a reset switch connected to the common signal line; for supplying a reference voltage to the common signal line; wherein the reset switch and the switching elements turn ON to reset the light receiving elements to the reference voltage after reading out the output signals from the light receiving elements to the common signal line.

2. An image sensor according to claim 1; wherein the reset switch is disposed between a reference voltage terminal and the chip selection switch.

3. An image sensor according to claim 1; further comprising a reference voltage terminal and a reference voltage generating circuit for supplying the reference voltage to the reference voltage terminal through a resistor.

4. An image sensor according to claim 1; further comprising a plurality of unit blocks each having at least the light receiving element circuit array, the switching element circuit array, the scanning circuit array, the common signal line, the reset switch, the image signal output terminal, and the reference voltage terminal, the reference voltage terminals of the unit blocks being connected to one another.

5. An image sensor according to claim 4; wherein the unit blocks comprise integrated circuits arranged in series.

6. An image sensor according to claim 4; further comprising a capacitance formed between the reference voltage terminals and a ground potential.

7. An image sensor according to claim 4; further comprising a capacitance formed between the reference voltage terminals and a power source potential.

8. An image sensor according to claim 5; further comprising means for supplying a reference voltage to the reference voltage terminals from outside of the integrated circuits.

* * * * *